US010356863B2

(12) United States Patent
Xu et al.

(10) Patent No.: US 10,356,863 B2
(45) Date of Patent: Jul. 16, 2019

(54) LED DRIVER, CIRCUIT AND METHOD FOR DETECTING INPUT SOURCE

(71) Applicant: Silergy Semiconductor Technology (Hangzhou) LTD, Hangzhou, ZheJiang Province (CN)

(72) Inventors: Xiaoqiang Xu, Hangzhou (CN); Jianxin Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/135,312

(22) Filed: Sep. 19, 2018

(65) Prior Publication Data

US 2019/0110346 A1 Apr. 11, 2019

(30) Foreign Application Priority Data

Oct. 10, 2017 (CN) .......................... 2017 1 0932179

(51) Int. Cl.
*G01R 29/00* (2006.01)
*H05B 33/08* (2006.01)

(52) U.S. Cl.
CPC ..... *H05B 33/0842* (2013.01); *H05B 33/0815* (2013.01)

(58) Field of Classification Search
None
See application file for complete search history.

(56) References Cited

U.S. PATENT DOCUMENTS

| | | | | |
|---|---|---|---|---|
| 8,614,551 | B2 | 12/2013 | Chen et al. | |
| 9,125,270 | B2 | 9/2015 | Liao et al. | |
| 9,578,706 | B1 | 2/2017 | Lai et al. | |
| 2014/0062322 | A1 | 3/2014 | Yu et al. | |
| 2014/0139107 | A1 * | 5/2014 | Hariharan .......... | H05B 33/0815 315/85 |

* cited by examiner

*Primary Examiner* — Tung X Le
*Assistant Examiner* — Henry Luong
(74) *Attorney, Agent, or Firm* — Michael C. Stephens, Jr.

(57) ABSTRACT

A method of controlling an LED driver can include: generating a first comparison signal using a first reference voltage, the first comparison signal having a duty cycle in accordance with an alternating current input voltage generated by a transformer of the LED driver, and representing an operation frequency of an input source; generating a conversion voltage signal by an averaging operation of the first comparison signal with a time constant that is greater than a switching period of an electronic transformer; generating a second comparison signal by comparing the conversion voltage signal against a second reference voltage; and determining whether the transformer is the electronic transformer or a power frequency transformer based on the second comparison signal.

19 Claims, 7 Drawing Sheets

LED DRIVER, CIRCUIT AND METHOD FOR DETECTING INPUT SOURCE

RELATED APPLICATIONS

This application claims the benefit of Chinese Patent Application No. 201710932179.8, filed on Oct. 10, 2017, which is incorporated herein by reference in its entirety.

FIELD OF THE INVENTION

The present invention generally relates to the field of power electronics, and more particularly to a light-emitting diode (LED) driver, and associated circuits and methods for detecting an input source.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

As a common input source in power systems, transformers are widely used in various electronic products in order to realize voltage conversion. An alternating current (AC) input voltage signal generated by the transformer can be rectified by a rectifier circuit to be a rectified signal. Due to electromagnetic interference, the rectified signal may need to be filtered by a filter circuit before being provided as an input signal of a power converter. The filter circuit can be substantially realized by a filter capacitor to perform the filtering function. The filter capacitor may not only suppress electromagnetic interference, but can also meet compatibility between the transformer and the power converter.

Figure 1:
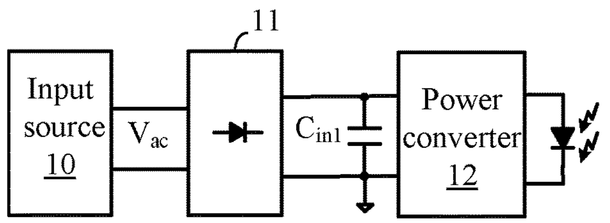
FIG. 1 is a schematic block diagram of an example LED driver.

Referring now to FIG. 1, shown is a schematic block diagram of an example light-emitting diode (LED) driver. For example, input source 10 can be a transformer. Alternating current input voltage $V_{ac}$ generated by input source 10 can be rectified by rectifier circuit 11, and filtered by input capacitor $C_{in1}$ to provide to power converter 12. When the power of input source 10 is relatively large, the capacitance of input capacitor $C_{in1}$ should be sufficiently large in order to achieve power decoupling, and to suppress electromagnetic interference. However, such a large capacitance may not be conducive to the compatibility of input source 10. When the power of input source 10 is relatively small, the capacitance of input capacitor $C_{in1}$ can also be small to directly perform power conversion. However, the smaller capacitance of input capacitor $C_{in1}$ may be not conducive to the suppression of electromagnetic interference, and may also affect circuit performance. For different input source types, input capacitor $C_{in1}$ may not flexibly change capacitance in order to suit the needs of the circuit, thus allowing potential problems of electromagnetic interference and compatibility.

In one embodiment, a method of controlling an LED driver can include: (i) generating a first comparison signal using a first reference voltage, the first comparison signal having a duty cycle in accordance with an alternating current input voltage generated by a transformer of the LED driver, and representing an operation frequency of an input source; (ii) generating a conversion voltage signal by an averaging operation of the first comparison signal with a time constant that is greater than a switching period of an electronic transformer; (iii) generating a second comparison signal by comparing the conversion voltage signal against a second reference voltage; and (iv) determining whether the transformer is the electronic transformer or a power frequency transformer based on the second comparison signal.

Figure 2:
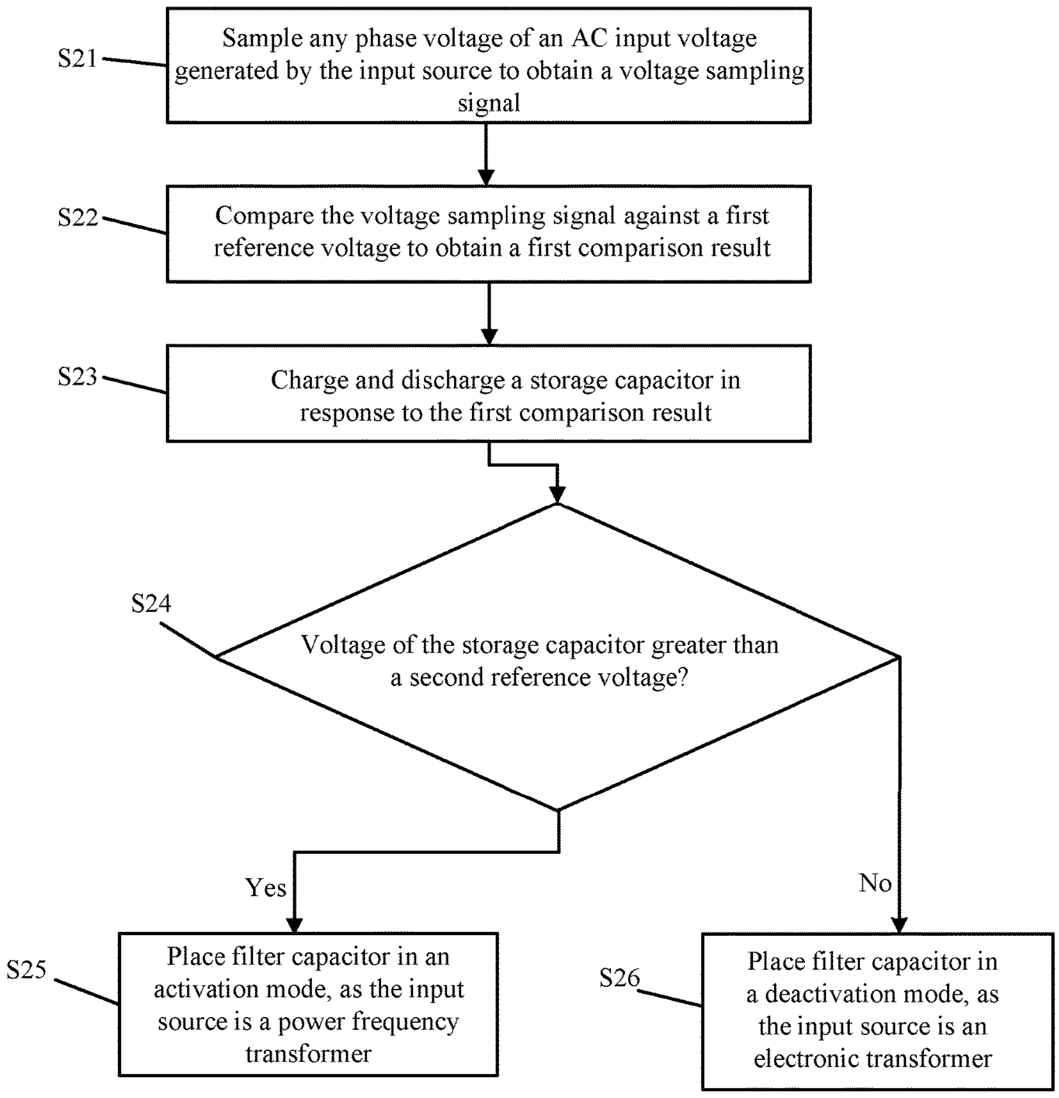
FIG. 2 is a flow diagram of an example method of detecting an input source, in accordance with embodiments of the present invention.

Referring now to FIG. 2, shown is a flow diagram of an example detection method for an input source, in accordance with embodiments of the present invention. At S21, any phase voltage of an alternating current input voltage generated by the input source (e.g., a type of transformer) can be sampled in order to obtain a voltage sampling signal. At S22, the voltage sampling signal can be compared against a first reference voltage to generate a first comparison signal. For example, the first comparison signal may have a duty cycle in accordance with the AC input voltage generated by a transformer, and may represent an operation frequency of the input source. At S23, a storage capacitor can be charged and discharged in response to the first comparison signal. Also, a conversion voltage signal can be generated by an averaging operation of the first comparison signal with a time constant greater than a switching period of an electronic transformer.

At S24, the voltage of the storage capacitor (e.g., the conversion voltage signal) can be compared against a second reference voltage to generate a second comparison signal, which can be utilized to distinguish the types of the transformers of the input source. Whether the transformer is an electronic transformer or a power frequency transformer can thus be determined in accordance with the second comparison signal. As used herein, a "power frequency transformer" may generally be a transformer that operates at an industrial frequency (e.g., about 50 Hz), while an "electronic transformer" may generally be a transformer that operates at a higher frequency (e.g., greater than about 1 kHz). When the transformer is an electronic transformer, capacitance coupled to output terminals of a rectifier circuit can be decreased in accordance with the second comparison signal. When the transformer is a power frequency transformer, the capacitance coupled to output terminals of the rectifier circuit can be increased in accordance with the second comparison signal. At S25, if the voltage of the storage capacitor is greater than the second reference voltage, the input source is determined as a power frequency transformer, and a filter capacitor can be placed in an activated mode. At S26, if the voltage the storage capacitor is less than the second reference voltage, the input source is determined to be an electronic transformer, and the filter capacitor can be placed in a deactivated mode.

For example, when the transformer is a power frequency transformer, the voltage sampling signal may be greater than zero only when in a negative half cycle of the alternating current input voltage. When the transformer is an electronic transformer, the voltage sampling signal may include pulses of increased switching frequencies. For example, the voltage sampling signal can be sampled by an RC filter circuit, and the first reference voltage may be slightly greater than zero (e.g., greater than zero by no more than a predetermined value). In addition, a control signal can be generated in accordance with the second comparison signal for a transistor that is coupled in series with the capacitor between output terminals of the rectifier circuit. For example, the second reference voltage can be determined in accordance with an average value of the conversion voltage signal when the conversion voltage signal is not zero and the transformer is an electronic transformer. In particular embodiments, the type of the input source can be determined by sampling the AC input voltage that is generated by the input source, and then the effective filter capacitance can be set according to the type of the input source. In this way, problems of electromagnetic interference and circuit compatibility in the power system can be substantially avoid.

In one embodiment, a circuit for an LED driver can include: (i) a first comparison circuit configured to generate a first comparison signal using a first reference voltage, the first comparison signal having a duty cycle in accordance with an alternating current input voltage generated by a transformer of the LED driver, and representing an operation frequency of an input source; (ii) a conversion circuit configured to generate a conversion voltage signal by an averaging operation of the first comparison signal with a time constant that is greater than a switching period of an electronic transformer; (iii) a second comparison circuit configured to compare the conversion voltage signal against a second reference voltage, and to generate a second comparison signal; and (iv) a logic circuit configured to determine whether the transformer is the electronic transformer or a power frequency transformer based on the second comparison signal.

Figure 3:
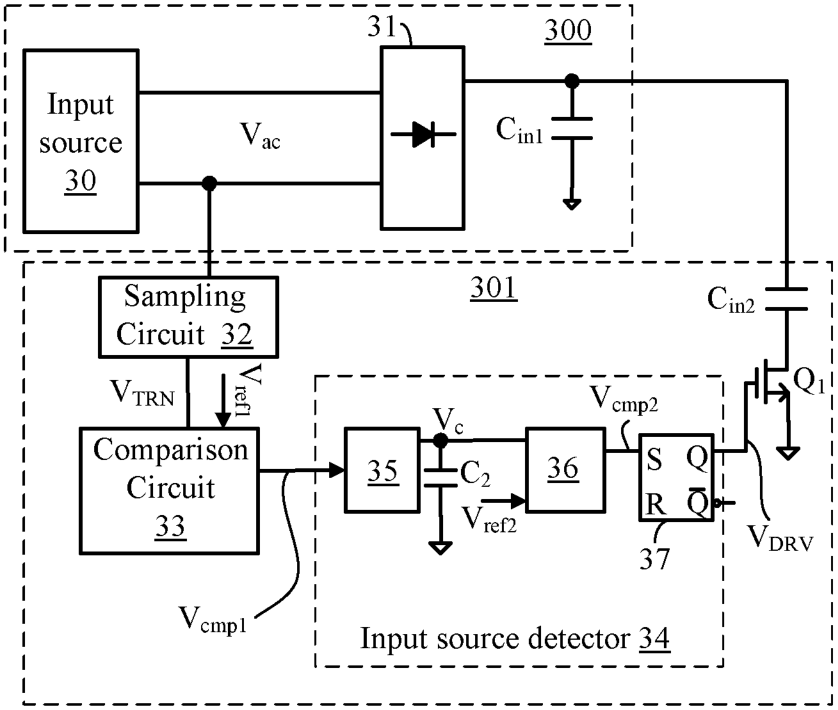
FIG. 3 is a schematic block diagram of an example circuit for detecting an input source, in accordance with embodiments of the present invention.

Referring now to FIG. 3, shown is a schematic block diagram of another example detection circuit for an input source, in accordance with embodiments of the present invention. In this particular example, the circuit can include driver 300 and detection circuit 301 for the input source. Driver 300 can include input source 30, rectifier circuit 31, and input capacitor $C_{in1}$. The connection relationship and operation of the circuit elements in circuit 301 of the present invention will be described in detail below. Detection circuit 301 can also be a control circuit for an LED driver including a transformer as the input source.

Detection circuit 301 can include sampling circuit 32, comparison circuit 33, input source detector 34, filter capacitor $C_{in2}$, and a switch device (e.g., transistor $Q_1$). Sampling circuit 32 connected to an output terminal of input source 30 can receive AC input voltage $V_{ac}$, and may generate voltage sampling signal $V_{TRN}$ that characterizes a phase voltage of AC input voltage $V_{ac}$. Comparison circuit 33 can generate comparison signal $V_{cmp1}$ with a duty cycle that represents an operation frequency of input source 30, in accordance with AC input voltage $V_{ac}$ generated by the transformer as input source 30. Comparison circuit 33 can compare voltage sampling signal $V_{TRN}$ against reference voltage $V_{ref1}$ in order to generate comparison signal $V_{cmp1}$. Input source detector 34 can include switching circuit 35, comparison circuit 36, and RS flip-flop 37. Switching circuit 35 can charge and discharge storage capacitor $C_2$ in response to comparison signal $V_{cmp1}$.

A conversion circuit can include switching circuit 35 and storage capacitor $C_2$. The conversion circuit can generate conversion voltage $V_c$ by an averaging operation of comparison signal $V_{cmp1}$ with the time constant greater than a switching period of the electronic transformer. Comparison circuit 36 can compare voltage $V_c$ of storage capacitor $C_2$ (e.g., conversion voltage $V_c$) against reference voltage $V_{ref2}$ in order to generate comparison signal $V_{cmp2}$. Comparison circuit 36 can determine whether the transformer is an electronic transformer or a power frequency transformer type. RS flip-flop 37 can receive comparison signal $V_{cmp2}$ at set terminal S, and may generate control signal $V_{DRV}$ at output terminal Q. Control signal $V_{DRV}$ can control the on-off state of transistor $Q_1$. When comparison signal $V_{cmp2}$ is high, input source 30 can be detected as power frequency transformer, transistor $Q_1$ controlled by control signal $V_{DRV}$ can be turned on, and filter capacitor $C_{in2}$ can be placed in an activated mode (e.g., enabled). When comparison signal $V_{cmp2}$ is low, input source 30 can be detected as an electronic transformer, transistor $Q_1$ controlled by control signal $V_{DRV}$ can be turned off, and filter capacitor $C_{in2}$ can be placed in a deactivated mode (e.g., disabled).

Figure 4A:
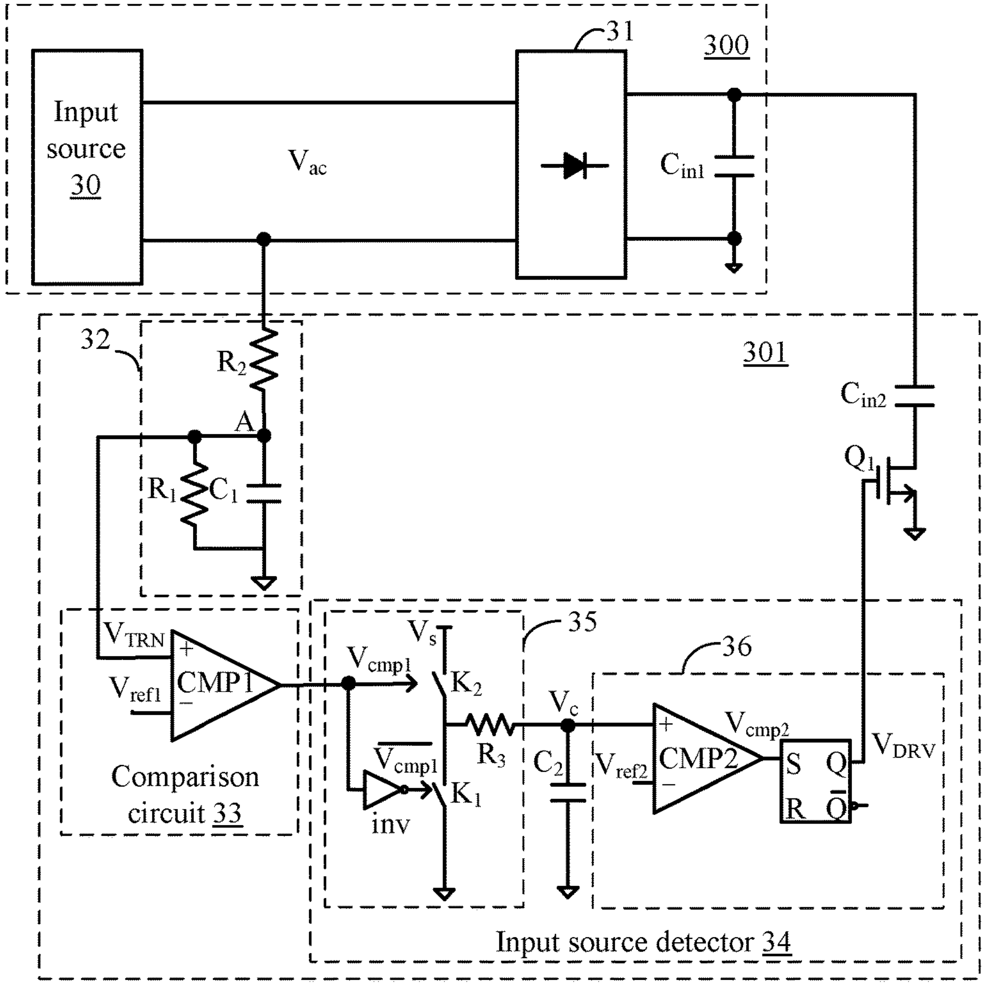
FIG. 4A is a schematic block diagram of another circuit for detecting an input source, in accordance with embodiments of the present invention.

Referring now to FIG. 4A, shown is a schematic block diagram of another example detection circuit for an input source, in accordance with embodiments of the present invention. In this particular example, sampling circuit 32 in detection circuit 301 can include resistor $R_1$ and capacitor $C_1$ connected in parallel to form a RC filter circuit, and resistor $R_2$. One terminal of resistor $R_2$ can connect in series with the RC filter circuit, and the other terminal of resistor $R_2$ can receive AC input voltage $V_{ac}$ generated by input source 30. At common node A of the RC filter circuit and resistor $R_2$, voltage sampling signal $V_{TRN}$ that characterizes a phase voltage of AC input voltage $V_{ac}$ can be generated. Comparison circuit 33 can include comparator CMP1, which can receive reference voltage $V_{ref1}$ at the inverting input terminal, and voltage sampling signal $V_{TRN}$ at the non-inverting input terminal. Comparator CMP1 can compare reference voltage $V_{ref1}$ against voltage sampling signal $V_{TRN}$ in order to generate comparison signal $V_{cmp1}$.

Input source detector 34 can include switching circuit 35, storage capacitor $C_2$, second comparison circuit 36, and RS flip-flop 37. The conversion circuit can include switching circuit 35 and a filter circuit. Switching circuit 35 can include switches $K_1$ and $K_2$, which are connected in series between voltage source $V_S$ and ground. Switch $K_2$ can be controlled by comparison result $V_{cmp1}$ to be turned on or off, and one terminal of switch $K_2$ can connect to voltage source $V_S$. Switch $K_1$ can be controlled to be turned on or off by an inverted version of signal $V_{cmp1}$ generated by inverter inv, and one terminal of switch $K_1$ can be grounded. Inverter inv can receive comparison signal $V_{cmp1}$, and generate the inverted version of signal $V_{cmp1}$. Switches $K_1$ and $K_2$ may thus have complementary operation. One terminal of resistor $R_3$ can connect to the common node between switches $K_1$ and $K_2$, and the other terminal of resistor $R_3$ can connect to storage capacitor $C_2$. Storage capacitor $C_2$ can connect with switch $K_1$ in parallel through resistor $R_3$. The filter circuit including storage capacitor $C_2$ and resistor $R_3$ can connect to the common node between switches $K_1$ and $K_2$, and may generate conversion voltage signal $V_c$. The filter circuit can be configured as an RC filter circuit with a time constant greater than the switching period of the electronic transformer, in order to guarantee that an averaging operation of comparison signal $V_{cmp1}$ can be achieved.

Comparison circuit 36 can include comparator CMP2, which can receive reference voltage $V_{ref2}$ at its inverting input terminal, and voltage $V_c$ of storage capacitor $C_2$ at its non-inverting input terminal, and can generate comparison signal $V_{cmp2}$. Comparator CMP2 can compare reference voltage $V_{ref2}$ against voltage Vc in order to generate comparison signal $V_{cmp2}$. RS flip-flop 37 can receive comparison signal $V_{cmp2}$ at set terminal S, and may generate control signal $V_{DRV}$ at output terminal Q. The control terminal of transistor $Q_1$ can connect to output terminal Q of RS flip-flop 37, and a first terminal of transistor $Q_1$ can connect to filter capacitor $C_{in2}$. Detection circuit 301 can also include a capacitance regulation circuit including transistor $Q_1$ connected in series with filter capacitor $C_{in2}$. The capacitance regulation circuit can connect to output terminals of rectifier circuit 31, which can be connected to the transformer. When the transformer is configured as an electronic transformer, capacitance connected to output terminals of rectifier circuit 31 can be decreased in accordance with comparison signal $V_{cmp2}$ by disabling capacitor $C_{in2}$. When the transformer is configured as a power frequency transformer, the capacitance can be increased in accordance with comparison signal $V_{cmp2}$ by enabling capacitor $C_{in2}$.

In this particular example, transistor $Q_1$ can be an N-type MOS (NMOS) transistor. The first terminal of transistor $Q_1$ can be source terminal, second terminal can be drain terminal, and the control terminal can be gate terminal. Those skilled in the art will recognize that transistor $Q_1$ can alternatively be any other suitable switching device (e.g., P-type MOS transistor, BJT device, etc.) in order to adaptively adjust the circuit based on the input source transformer type.

Sampling circuit 32 in detection circuit 301 can sample AC input voltage $V_{ac}$ generated by input source 30 in order to generate voltage sampling signal $V_{TRN}$ that characterizes a phase voltage of AC input voltage $V_{ac}$. Comparison circuit 33 can compare voltage sampling signal $V_{TRN}$ against reference voltage $V_{ref1}$ in order to generate comparison signal $V_{cmp1}$. Switching circuit 35 can charge and discharge storage capacitor $C_2$ in response to comparison signal $V_{cmp1}$. When switch $K_2$ is turned on, storage capacitor $C_2$ can receive the voltage of voltage source $V_S$ through resistor $R_3$ to be charged. When switch $K_1$ is turned on, storage capacitor $C_2$ can be grounded through resistor $R_3$ to be discharged. Comparison circuit 36 can compare voltage $V_c$ of storage capacitor $C_2$ against reference voltage $V_{ref2}$ in order to generate comparison signal $V_{cmp2}$.

When voltage $V_c$ is greater than reference voltage $V_{ref2}$, comparison signal $V_{cmp2}$ can be high, and input source 30 can be detected as a power frequency transformer, such that filter capacitor $C_{in2}$ is placed in an activated mode (e.g., enabled), and input capacitor $C_{in2}$ can connect in parallel with capacitor $C_{in1}$ in driver 300. Since the capacitance of filter capacitor $C_{in2}$ is typically much larger than the capacitance of input capacitor $C_{in1}$, the total capacitance of the filter capacitor can be increased when capacitor $C_{in2}$ is enabled. When voltage $V_c$ is less than reference voltage $V_{ref2}$, comparison signal $V_{cmp2}$ can be low such that filter capacitor $C_{in2}$ may be placed in a deactivated mode (e.g., disabled) and thus cut off from capacitor $C_{in1}$ in driver 300, such that the total filter capacitance is accordingly decreased.

Figure 4B:
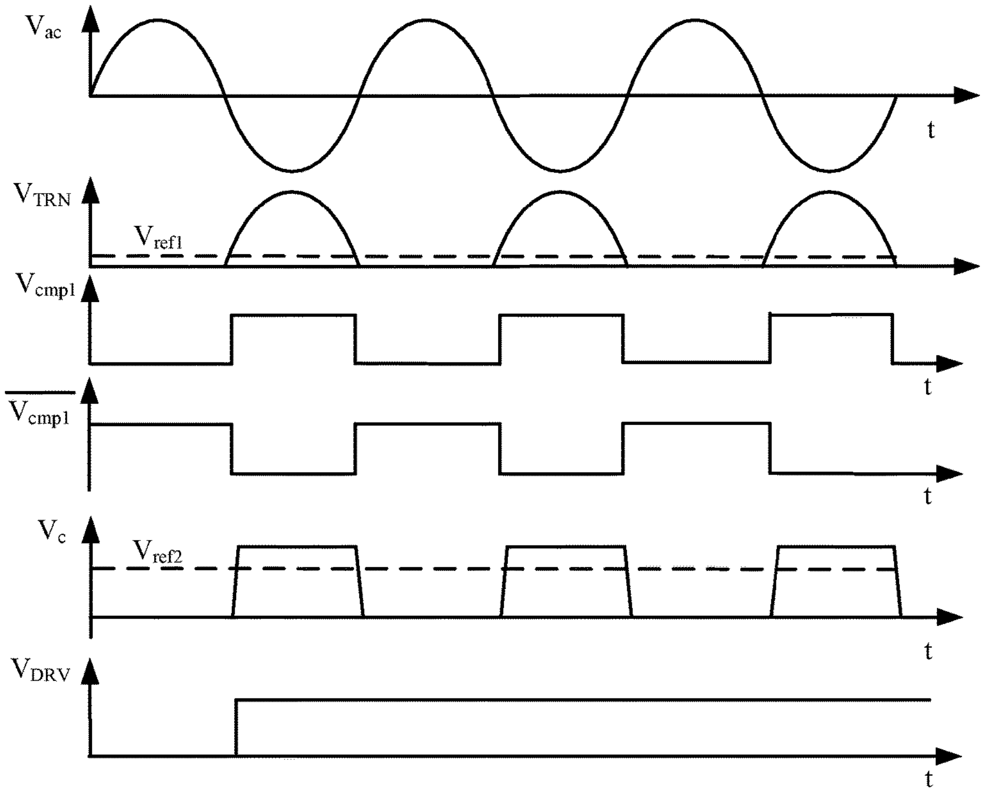
FIG. 4B is a waveform diagram of example operation of an example detection circuit, in accordance with embodiments of the present invention.

Referring now to FIG. 4B, shown is a waveform diagram of example operation of the example detection circuit, in accordance with embodiments of the present invention. When input source 30 is a power frequency type of transformer, voltage sampling signal $V_{TRN}$ obtained by sampling AC input voltage $V_{ac}$ can be a periodic signal with a high level in one half of the power frequency cycle and a low level in the other half of the power frequency cycle. Voltage sampling signal $V_{TRN}$ may be greater than zero only when in a negative half cycle of the AC input voltage $V_{ac}$. Comparison circuit 33 can compare voltage sampling signal $V_{TRN}$ against reference voltage $V_{ref1}$ in order to generate comparison signal $V_{cmp1}$ with a duty cycle corresponding to the AC input voltage and that represents an operation frequency of the input source. For example, reference voltage $V_{ref1}$ can be slightly greater than zero (e.g., greater than zero by no more than a predetermined value). When voltage sampling signal $V_{TRN}$ is high, comparison result $V_{cmp1}$ can be high, and switch $K_2$ can be turned on such that storage capacitor $C_2$ can receive voltage source $V_S$ through resistor $R_3$ to be charged.

When voltage $V_c$ of storage capacitor $C_2$ increases to be equal to reference voltage $V_{ref2}$, set terminal S of RS flip-flop 37 can be set and control signal $V_{DRV}$ generated by RS flip-flop 37 can be high. When voltage sampling signal $V_{TRN}$ is low, comparison result $V_{cmp1}$ can be low, and switch $K_1$ can be turned on such that storage capacitor $C_2$ can be grounded through resistor $R_3$ to be discharged, and voltage $V_c$ of storage capacitor $C_2$ can go low. Since the reset terminal of RS flip-flop 37 may receive an inactive signal, the output terminal of RS flip-flop 37 can remain in its previous state, and control signal $V_{DRV}$ can remain high. When input source 30 is a power frequency transformer, control signal $V_{DRV}$ can remain high such that transistor $Q_1$ can be on, filter capacitor $C_{in2}$ can connect to driver 300, and the capacitance connected to output terminals of the rectifier circuit can accordingly be increased.

Figure 4C:
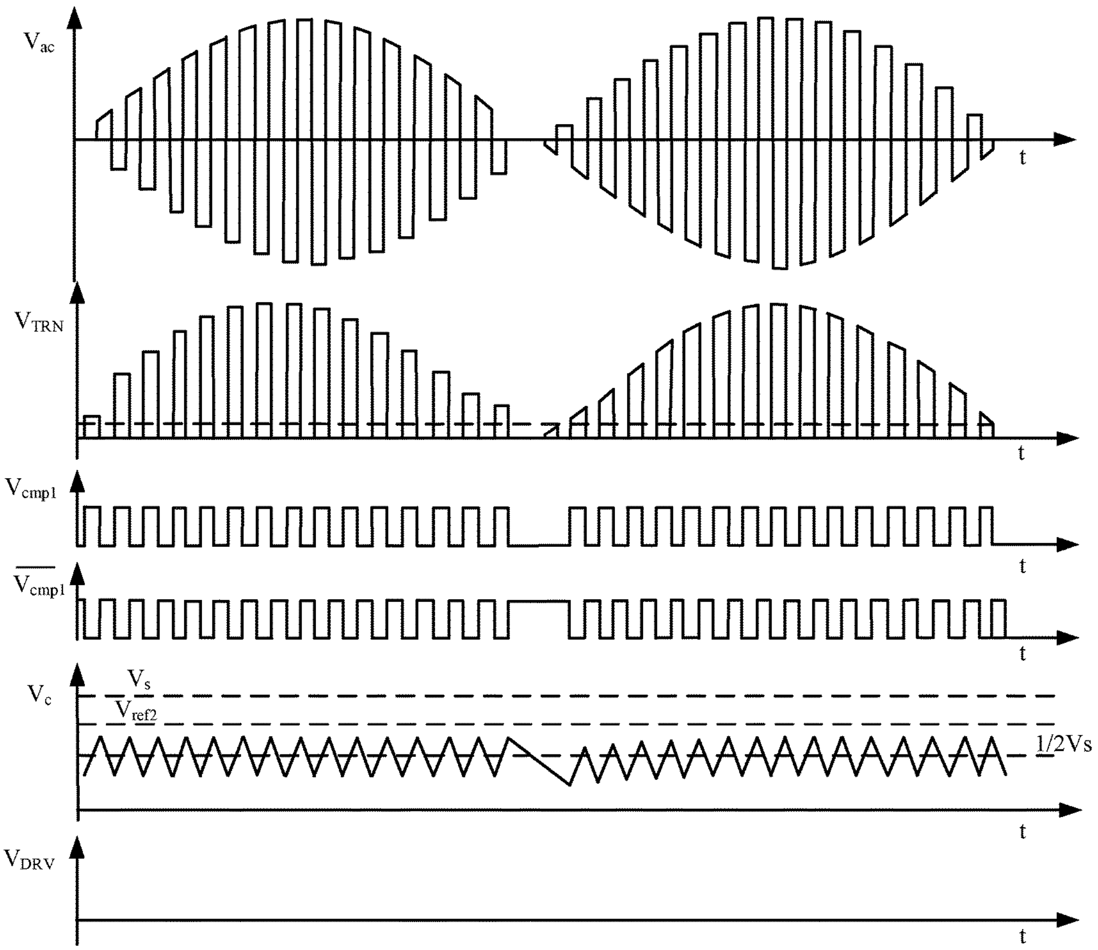
FIG. 4C is another waveform of example operation of an example detection circuit, in accordance with embodiments of the present invention.

Referring now to FIG. 4C, is another waveform of example operation of the example detection circuit, in accordance with embodiments of the present invention. When input source 30 is an electronic transformer type, voltage sampling signal $V_{TRN}$ obtained by sampling AC input voltage $V_{ac}$ may be a periodic signal with a low level in a half of one switching cycle and a high level in the other half of switching cycle, and can include pulses of the switching frequency with values no less than zero. When voltage sampling signal $V_{TRN}$ is low, comparison result $V_{cmp1}$ can be low, and switch $K_1$ can be turned on such that storage capacitor $C_2$ may be grounded to be discharge through resistor $R_3$. When voltage sampling signal $V_{TRN}$ is high, comparison signal $V_{cmp1}$ can be high, and switch $K_2$ can be turned on such that storage capacitor $C_2$ can receive voltage source $V_S$ through resistor $R_3$ to be charged. Therefore, the average value of voltage $V_c$ can be a half of the voltage of voltage source $V_S$ in each cycle.

In one example, the cycle of the electronic transformer is 20 kHz-200 kHz, and reference voltage $V_{ref2}$ can be determined in accordance with the average value of conversion voltage signal $V_c$ when the transformer is an electronic transformer, and reference voltage $V_{ref2}$ can be greater than one half of a voltage of voltage source $V_S$, and less than the voltage of voltage source $V_S$. for example, reference voltage $V_{ref2}$ can be equal to three quarters of the voltage of voltage source $V_S$, such that voltage $V_c$ can always be less than reference voltage $V_{ref2}$. Thus, the output of comparator CMP2 can remain low, control signal $V_{DRV}$ can remain low, transistor $Q_1$ can be turned off, filter capacitor $C_{in2}$ can be in a deactivated mode, and the capacitance connected to output terminals of the rectifier circuit can accordingly be decreased.

Figure 5:
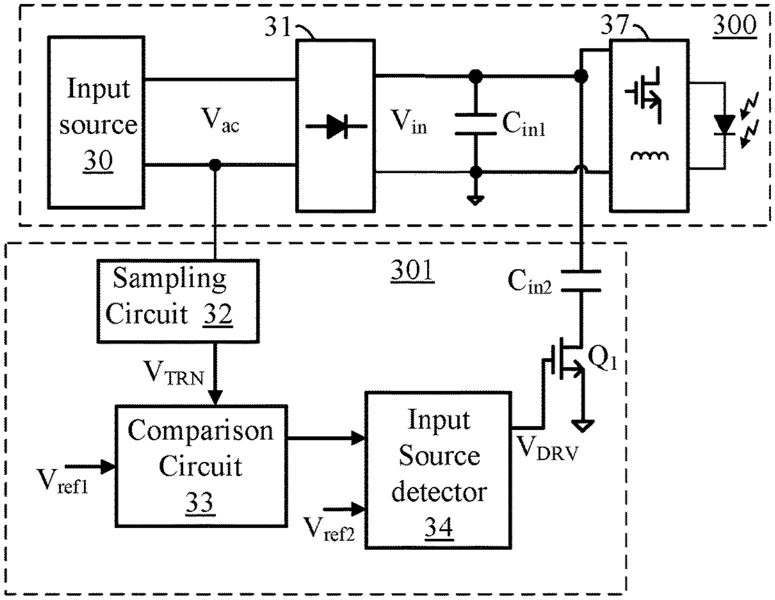
FIG. 5 is a schematic block diagram of an example LED driver, in accordance with embodiments of the present invention.

Referring now to FIG. 5, shown is a schematic block diagram of an example LED driver circuit, in accordance with embodiments of the present invention. In this particular example, LED driver 300 can be utilized to drive an LED lamp, and may include input source 30, rectifier circuit 31, input capacitor $C_{in1}$, power converting circuit 37, and detection circuit 301 for detecting input source 30. In this example, input capacitor $C_{in1}$ can connect between the two output terminals of rectifier circuit 31. AC input voltage $V_{ac}$ generated by input source 30 can be converted into direct current signal $V_{in}$ by rectifier circuit 31. Power converter 37 can be any suitable converter topology (e.g., buck, boost-buck, forward, flyback, etc.) according to different connection approaches (e.g., with switching tubes, rectifiers, inductors, capacitors, etc.), in order to drive LED loads.

In particular embodiments, detection circuit 301 for input source 30 can be utilized to distinguish the types of input source 30. When input source 30 is a power frequency transformer, due to the relatively low operating frequency of the power frequency transformer, filter capacitor $C_{in2}$ with a relatively large capacitance value can be enabled to connect between the two output terminals of rectifier circuit 31, in order to filter the output voltage of rectifier circuit 31. When input source 30 is an electronic transformer, due to the relatively high operating frequency of the electronic transformer, input capacitor $C_{in1}$ with a relatively small capacitance value can be utilized (with capacitor $C_{in2}$ being disabled), in order to filter the output voltage of rectifier circuit 31. In this way, the filter capacitance can be adaptively selected according to the type of the transformer as the input source, such that potential problems of electromagnetic interference and the compatibility of transformer can be addressed in order to improve driving in control of the associated LED lamp.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of controlling a light-emitting diode (LED) driver, the method comprising:

a) generating a first comparison signal using a first reference voltage, said first comparison signal having a duty cycle in accordance with an alternating current input voltage generated by a transformer of said LED driver, and representing an operation frequency of an input source;

b) generating, by a conversion circuit having first and second switches coupled in series between a voltage source and ground, and a filter circuit coupled to a common node between said first and second switches, a conversion voltage signal, wherein said first and second switches are controlled by said first comparison signal and have complementary switching states;

c) generating a second comparison signal by comparing said conversion voltage signal against a second reference voltage; and d) determining whether said transformer is an electronic transformer or a power frequency transformer based on said second comparison signal.

2. The method of claim 1, wherein:

a) said transformer is detected as said electronic transformer when said conversion voltage signal is less than said second reference voltage; and b) said transformer is detected as said power frequency transformer when said conversion voltage signal is greater than said second reference voltage.

3. The method of claim 1, further comprising:

a) decreasing capacitance coupled to output terminals of a rectifier circuit in accordance with said second comparison signal when said transformer is detected as said electronic transformer; and b) increasing capacitance coupled to said output terminals of said rectifier circuit in accordance with said second comparison signal when said transformer is detected as said power frequency transformer.

4. The method of claim 1, further comprising sampling said alternating current input voltage to generate a voltage sampling signal, wherein:

a) said voltage sampling signal is greater than zero only when in a negative half cycle of said alternating current input voltage when said transformer is detected as said power frequency transformer; and b) said voltage sampling signal comprises a plurality of pulses of said switching frequency with values not less than zero when said transformer is detected as said electronic transformer.

5. The method of claim 4, further comprising comparing said voltage sampling signal against said first reference voltage to generate said first comparison signal.

6. The method of claim 4, wherein only one phase of said alternating current input voltage is sampled by an RC filter circuit to generate said voltage sampling signal.

7. The method of claim 3, further comprising generating a control signal in accordance with said second comparison signal for a transistor that is coupled in series with a capacitor, wherein said capacitor is coupled to an output terminal of said rectifier circuit.

8. The method of claim 1, further comprising determining said second reference voltage in accordance with an average value of said conversion voltage signal.

9. A circuit for a light-emitting diode (LED) driver, the circuit comprising:

a) a first comparison circuit configured to generate a first comparison signal using a first reference voltage, said first comparison signal having a duty cycle in accordance with an alternating current input voltage generated by a transformer of said LED driver, and representing an operation frequency of an input source;

b) a conversion circuit comprising first and second switches coupled in series between a voltage source and ground, and a filter circuit coupled to a common node between said first and second switches, and being configured to generate a conversion voltage signal, wherein said first and second switches are controlled by said first comparison signal and have complementary switching states;

c) a second comparison circuit configured to compare said conversion voltage signal against a second reference voltage, and to generate a second comparison signal; and d) a logic circuit configured to determine whether said transformer is an electronic transformer or a power frequency transformer based on said second comparison signal.

10. The circuit of claim 9, wherein said filter circuit is configured as an RC filter circuit with said time constant greater than said switching period of said electronic transformer in order to average said first comparison signal.

11. The circuit of claim 9, wherein:

a) said transformer is detected as said electronic transformer when said conversion voltage signal is less than said second reference voltage; and b) said transformer is detected as said power frequency transformer when said conversion voltage signal is greater than said second reference voltage.

12. The circuit of claim 9, further comprising:

a) a capacitance regulation circuit configured to decrease a capacitance coupled to output terminals of said rectifier circuit in accordance with said second comparison signal when said transformer is detected as said electronic transformer; and b) capacitance regulation circuit configured to increase said capacitance in accordance with said second comparison signal when said transformer is detected as said power frequency transformer.

13. The circuit of claim 12, wherein said capacitance regulation circuit comprises a transistor coupled in series with a capacitor, wherein said transistor is controlled in accordance with said second comparison signal.

14. The circuit of claim 13, wherein said second comparison circuit comprises:

a) a comparator configured to compare said conversion voltage signal against said second reference voltage; and b) a control signal generation circuit coupled to an output terminal of said comparator, and being configured to generate a control signal to control said transistor.

15. The circuit of claim 9, further comprising a sampling circuit configured to sample said alternating current input voltage to generate a voltage sampling signal, wherein:

a) said voltage sampling signal is greater than zero only when in a negative half cycle of the alternating current input voltage when said transformer is detected as said power frequency transformer; and b) said voltage sampling signal comprises a plurality of pulses of said switching frequency with values no less than zero when said transformer is detected as said electronic transformer.

16. The circuit of claim 15, wherein said sampling circuit is configured to sample only one phase of said alternating current input voltage to generate said voltage sampling signal.

17. The circuit of claim 15, wherein said sampling circuit is configured as an RC filter circuit.

18. The circuit of claim 15, wherein said first comparison circuit is configured to compare said voltage sampling signal against said first reference voltage to generate said first comparison signal.

19. The circuit of claim 9, wherein said second reference voltage is determined in accordance with an average value of said conversion voltage signal.

* * * * *